(12) United States Patent
Wang

(10) Patent No.: US 6,930,934 B2
(45) Date of Patent: Aug. 16, 2005

(54) HIGH EFFICIENCY REDUNDANCY ARCHITECTURE IN SRAM COMPILER

(75) Inventor: Tao-Ping Wang, Hsinchu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 10/694,676

(22) Filed: Oct. 28, 2003

(65) Prior Publication Data
US 2005/0088887 A1 Apr. 28, 2005

(51) Int. Cl.⁷ .............................................. G11C 29/00
(52) U.S. Cl. .................................... 365/200; 365/225.7
(58) Field of Search .............................. 365/200, 225.7

(56) References Cited

U.S. PATENT DOCUMENTS

| | | | | |
|---|---|---|---|---|
| 3,753,235 A | * | 8/1973 | Daughton et al. ........... 365/200 |
| 4,691,301 A | | 9/1987 | Anderson ................... 365/200 |
| 4,807,191 A | | 2/1989 | Flannagan .................. 365/189 |
| 5,124,948 A | * | 6/1992 | Takizawa et al. ........... 365/200 |
| 5,134,584 A | | 7/1992 | Boler et al. ................. 365/200 |
| 5,199,035 A | * | 3/1993 | Lopez et al. ................ 365/200 |
| 5,257,229 A | | 10/1993 | McClure et al. ............. 365/200 |
| 5,430,679 A | * | 7/1995 | Hiltebeitel et al. .......... 365/200 |
| 5,612,918 A | | 3/1997 | McClure ..................... 365/200 |
| 5,742,556 A | | 4/1998 | Tavrow et al. ........... 365/225.7 |
| 5,923,601 A | * | 7/1999 | Wendell ..................... 365/200 |
| 6,067,262 A | * | 5/2000 | Irrinki et al. ................ 365/200 |
| 6,130,851 A | * | 10/2000 | Ichikawa ................. 365/225.7 |
| 6,512,708 B1 | * | 1/2003 | Hsuan et al. ................ 365/200 |

\* cited by examiner

*Primary Examiner*—Trong Phan

(57) ABSTRACT

A yield enhancement circuit substitutes a redundant sub-circuit for a faulty sub-circuit in an integrated circuit such as memory. The yield enhancement circuit has a plurality of fault indication devices, which is associated with one sub circuit of the integrated circuits such that one fault indication device is activated to generate a fault signal to express the existence of a fault within the faulty sub-circuit. Additionally selected adjacent fault indication devices generate the fault signal to express the existence of the fault within the faulty circuit. A fault detection device determines the existence of the faulty sub-circuit and transmits a redundancy implementation signal to a plurality of redundancy activation circuits. Each redundancy activation circuit selectively transfers input/output signals to a designated path dependent on the expression of the existence of a fault within the integrated circuit.

38 Claims, 5 Drawing Sheets

HIGH EFFICIENCY REDUNDANCY ARCHITECTURE IN SRAM COMPILER

BACKGROUND OF THE INVENTION

1. Field of the Invention

This invention relates generally to integrated circuits and more particularly to yield enhancement circuits by implementing redundant sub-circuits for faulty sub-circuits of the integrated circuits. Even more particularly this invention relates to yield enhancement circuits for substituting redundant columns of memory cells for faulty columns of memory cells in memory arrays such as static random access memory (SRAM).

2. Description of Related Art

Yield enhancement circuitry for integrated circuits, particularly for memory integrated circuits, is well known in the art. Memory integrated circuits are formed of multiple arrays of memory cells. Each memory array is constructed of rows and columns of memory cells. Normally, the rows of memory cells are selected by an address decoder. The columns of memory cells are bounded by read/write buffers that retrieve data from and store data to the selected memory cell. A column decoder provides a selection mechanism to guide data from a selected column to the read/write buffers. The output of the read/write buffer is transferred to an input/output driver and receiver to transfer the data between the memory cells and external circuitry.

In the processing of the memory circuits, contamination or defects within the process will cause faults within the memory circuit. To compensate for the faults within the memory circuits, redundant rows and columns of memory cells are appended adjacent to the array or within the array of memory cells. In array organizations where multiple columns of memory cells are arranged to provide data for one input/output circuit, a redundant column may be placed adjacent to the columns and connected for implementation to only those columns associated with the input/output circuit. This organization places a large overhead in space for the redundancy. For instance if the input/output circuit has eight columns for containing the data and one column of redundancy, the overhead for the redundancy becomes approximately 12.5%.

As process techniques have improved, contamination and defects have decreased, thus ameliorating the need for such high levels of redundancy. Rather than having one redundant column of memory cells per input/output circuit, one redundant column is added, associated, or appended to an array of memory cells. In some cases, there may be one redundant column of memory cells for multiple arrays positioned on a substrate. The wiring to connect the redundant column of memory cells so that it can be connected within the array or arrays is relatively long and affects the performance of the memory.

Refer now to FIG. 1 for a description of a memory having a redundant column of memory cells associated with an input/output circuit. In this illustration the memory is constructed of two arrays of memory cells 5 and 10. Within the two memory arrays 5 and 10, sub-arrays 15a, 15b, ..., 15z and 20a, ..., 20z are composed of columns 25a, ..., 25z of memory cells 30a, 30b, ..., 30z. A redundant column 35 of memory cells 40a, 40b, ..., 40z is positioned to be associated with the columns 25a, ..., 25z of memory cells 30a, 30b, ..., 30z.

Each of the columns 25a, ..., 25z of memory cells 30a, 30b, ..., 30z is connected to one of the redundancy implementation switches 45a, ..., 45z. The redundant column 35 of memory cells 40a, 40b, ..., 40z is connected to all the redundancy implementation switches 45a, ..., 45z.

The redundancy implementation switches 45a, ..., 45z are connected to the fuse box 50 which provides the necessary programming or indication of a fault within the columns 25a, ..., 25z of memory cells 30a, 30b, ..., 30z. If no fault occurs, the columns 25a, ..., 25z of memory cells 30a, 30b, ..., 30z are connected directly to the read/write buffer 55. However, if a fault is detected during testing of the memory, the fuse box 50 is programmed to indicate the column 25a, ..., 25z of memory cells 30a, 30b, ..., 30z containing the fault. The programming of the fuse box 55 sets the appropriate redundancy implementation switch 45a, ..., 45z associated with the faulty column 25a, ..., 25z of memory cells 30a, 30b, ..., 30z such that the redundant column 35 of memory cells 40a, 40b, ..., 40z is now connected to the read/write buffer 55.

The read/write buffer 55 contains the necessary circuitry to sense data from or store data in a selected memory cell within a selected column of the columns 25a, ..., 25z of memory cells 30a, 30b, ..., 30z. The column decoder 70 is connected to the read/write buffer 55 to select which of the columns 25a, ..., 25z of memory cells 30a, 30b, ..., 30z is to be activated for sensing or storing data. The column decoder 70 receives an address, which is decoded to provide the selection of the column 25a, ..., 25z of memory cells 30a, 30b, ..., 30z. The read/write buffer 55 is connected to an input/output circuit 60. The input/output circuit 60 contains a receiver to acquire data from the connector 65a, 65b, ..., 65m, 65n, ..., 65z and a driver to transfer data to the connector 65a, 65b, ..., 65m, 65n, ..., 65z. The connector 65a, 65b, ..., 65m, 65n, ..., 65z is in communication with external circuitry for transfer of the data.

It is apparent to one skilled in the art that the number of columns 25a, ..., 25z of memory cells 30a, 30b, ..., 30z associated with an input/output circuit 60 determines the efficiency of the redundancy of the array. This assumes that there is one redundant column 35 of memory cells 40a, 40b, ..., 40z within each sub-array 15a, 15b, ..., 15z and 20a, ..., 20z. In embedded memory applications, especially for SRAM applications, there may actually be a one-to-one correspondence of columns 25a, ..., 25z of memory cells 30a, 30b, ..., 30z to the input/output circuits 60.

Referring now to FIG. 2 for a description of a memory having a redundant column of memory cells associated with multiple memory arrays. In this illustration the memory is constructed of two arrays of memory cells 105 and 110. Within the two memory arrays 105 and 110, sub-arrays 115a, 115b, ..., 115z and 120a, ..., 120z are composed of columns 125a, ..., 125z of memory cells 130a, 130b, ..., 130z. A redundant column 135 of memory cells 140a, 140b, ..., 140z is positioned to be associated with the memory arrays 5 and 10. Each of the columns 125a, ..., 125z of memory cells 130a, 130b, ..., 130z is connected to one the redundancy implementation switches 145a, ..., 145z. The redundant column 135 of memory cells 140a, 140b, ..., 140z is connected to all the redundancy implementation switches 145a, ..., 145z.

The redundancy implementation switches 145a, ..., 145z are connected to the fuse box 150 which provides the necessary programming or indication of a fault within the columns 125a, ..., 125z of memory cells 130a, 130b, ..., 130z for all the sub-arrays 115a, 115b, ..., 115z and 120a, ..., 120z. If no fault occurs, the columns 125a, ..., 125z of memory cells 130a, 130b, ..., 130z are connected directly to the read/write buffer 155. However, if a fault is detected during testing of the memory, the fuse box 150 is programmed to indicate the column 125a. . . , 125z of memory cells 130a, 130b, . . . , 130z containing the fault. The programming of the fuse box 155 sets the redundancy implementation switch 145a, . . . , 145z associated with the faulty column 125a, . . . , 125z of memory cells 130a, 130b, . . . , 130z such that the redundant column 135 of memory cells 140a, 140b, . . . , 140z is now connected to the read/write buffer 155.

The read/write buffer 155 contains the necessary circuitry to sense data from or store data to a selected memory cell within a selected column of the columns 125a, . . . , 125z of memory cells 130a, 130b, . . . , 130z. The column decoder 170 is connected to the read/write buffer 155 to select which of the columns 125a, . . . , 125z of memory cells 130a, 130b, . . . , 130z is to be activated for sensing or storing of data. The column decoder 170 receives an address, which is decoded to provide the selection of the column 125a, . . . , 125z of memory cells 130a, 130b, . . . , 130z. The read/write buffer 155 is connected to an input/output circuit 160. The input/output circuit 160 contains a receiver to acquire data from the connector 165a, 165b, . . . , 165m, 165n, . . . , 165z and a driver to transfer data to the connector 165a, 165b, . . . , 165m, 165n, . . . , 165z. The connector 165a, 165b, . . . , 165m, 165n, . . . , 165z is in communication with external circuitry for transfer of the data.

It apparent to one skilled in the art that the number of columns 125a, . . . , 125z of memory cells 130a, 130b, . . . , 130z within the sub-arrays 115a, 115b, . . . , 115z and 120a, . . . , 120z and the total number of all the sub-arrays 115a, 115b, . . . , 115z and 120a, . . . , 120z determines the length of the connections to the redundant column 135 of memory cells 140a, 140b, . . . , 140z. The length of these connections has a detrimental impact on the performance of the memory when the redundant columns 135 of memory cells 140a, 140b, . . . , 140z are implemented.

U.S. Pat. No. 5,742,556 (Tavrow, et al.) describes a redundancy scheme for semiconductor RAMS. This integrated circuit memory structure includes a plurality of regular columns of memory cells arranged in a sequence such that each regular column except the last one has an associated adjacent regular column. Each regular column has associated sense amplifier circuitry and read write driver circuitry. The structure also includes a programmable element that responds to stimulus by providing a signal that identifies one of the regular columns as a defective column.

U.S. Pat. No. 5,612,918 (McClure) describes redundancy architecture that reduces the complexity of the redundancy structure because it has fewer pass gates in the redundant decoder.

U.S. Pat. No. 5,257,229 (McClure, et al.) describes a column redundancy architecture for a read/write memory whereby an integrated circuit memory has its primary memory array arranged into blocks with redundant columns. Each of the redundant column decoders includes a set of fuses for storing the column address responsive to its associated redundant column.

U.S. Pat. No. 5,134,584 (Boler, et al.) describes a configurable device that uses a plurality of parallel units that are made up of cells for storing individual bits of information. These cells are identified by address signals and selected to be interrogated. If a nonfunctional cell is detected within a parallel unit that parallel unit may be decoupled from the interrogator. The remainder of the parallel units is then shifted to different interrogators.

U.S. Pat. No. 4,807,191 (Flannagan) describes redundancy for block-architecture memory. This is explained as two stacks of memory blocks. Each block of sense amplifiers is coupled to a memory block. Located at the bottom of each stack of memory blocks is a redundant block of columns of memory cells. The redundant sense amplifier is also coupled to a redundant global data line. An input/output multiplexer is coupled to all of the global data lines. If one of the redundant columns replaces a defective column for a particular address, then the redundant global data line carries data which corresponds to the external data.

U.S. Pat. No. 4,691,301 (Anderson) describes a semiconductor memory with redundant column circuitry that includes a row of shared predecoder and predecoders. The selected decode output is determined by the row shared predecoder. A switch bank of single pole-double throw switches selects between a normal and a redundant output. When a defective column is replaced, all of the switches between the redundant column and the defective column have their states changed and the redundant column is activated. The address for each of the columns then has a lower position than the defective column incremented by one.

SUMMARY OF THE INVENTION

An object of this invention is to provide a yield enhancement circuit that minimally impacts timing performance upon implementation of a redundant circuit within an integrated circuit.

Another object of this invention is to provide a yield enhancement circuit for replacing a defective circuit with a redundant circuit while having a small effect in the area occupied by the integrated circuit.

To accomplish at least one these objects, a yield enhancement circuit is provided by substituting a redundant sub-circuit for a faulty sub-circuit in an integrated circuit such as memory. A memory is formed by an array of memory cells arranged in rows and columns. The redundant circuit is a redundant column memory cells or a redundant sub-circuit of the integrated circuit which is intended to replace a faulty column of memory cells within the memory array or integrated circuit.

The yield enhancement circuit has a plurality of fault indication devices. Each fault indication device is associated with one sub circuit of the integrated circuit such that one fault indication device is activated to generate a fault signal to express the existence of a fault within the faulty sub-circuit of the integrated circuit. Additionally each fault indication device that is associated with selected adjacent sub-circuits of the integrated circuit is activated generate the fault signal to express the existence of the fault within the faulty circuit of the integrated circuit.

The yield enhancement circuit has a fault detection device in communication with the plurality of fault indication devices to determine the existence of the faulty sub-circuit within the integrated circuit. The fault detection device transmits a redundancy implementation signal upon determination of existence of the faulty circuit.

The yield enhancement circuit further has a plurality of redundancy activation circuits that are in communication with the fault detection device in order to receive the redundancy implementation signal. Each redundancy activation circuit is in communication with one of the fault indication devices. Each redundancy activation circuit is associated with the sub-circuit to which the fault indication device is associated to selectively transfer input/output signals to a designated path dependent on the expression of the existence of a fault within the integrated circuit.

The redundancy activation circuit transfers the input/output signals of the circuit to their designated paths, if the fault indication device is not activated indicating that the associated sub-circuit has no fault and the redundancy implementation signal indicates that no fault exists in the integrated circuit. Further, the redundancy activation circuit transfers the input/output signals of the circuit to their designated path, if the fault indication device is not activated indicating that the associated circuit has no fault, but the redundancy implementation signal indicates that the fault exists in the integrated circuit. Whenever, the fault indication device is activated indicating existence of a faulty circuit and the redundancy implementation signal indicates that the fault exists in the integrated circuit, the input/output signals of the adjacent sub-circuit are transferred to the designated path.

The memory as above described is preferably a static random access memory, however dynamic random access memory, or non-volatile random access memory may be used with the yield enhancement circuit.

The columns of memory cells are connected to a read/write buffer connected to the column of memory cells to sense data stored in selected memory cells of the column and to store data to the memory cells of the column. The read/write buffer is connected to the designated path. The designated path is an input/output driver/receiver circuit that transfers the input/output signals from/to external circuitry.

Each fault indication device is comprised of a fuse. When the fuse is intact, the sub-circuit does not contain the fault and when the fuse is not intact, the sub-circuit contains the fault. Further, each fault indication device has a logical combining circuit. The logical combining circuit combines the fault signal indication device with the fault indication device that is associated with selected adjacent sub-circuits.

DETAILED DESCRIPTION OF THE INVENTION

Figure 1:
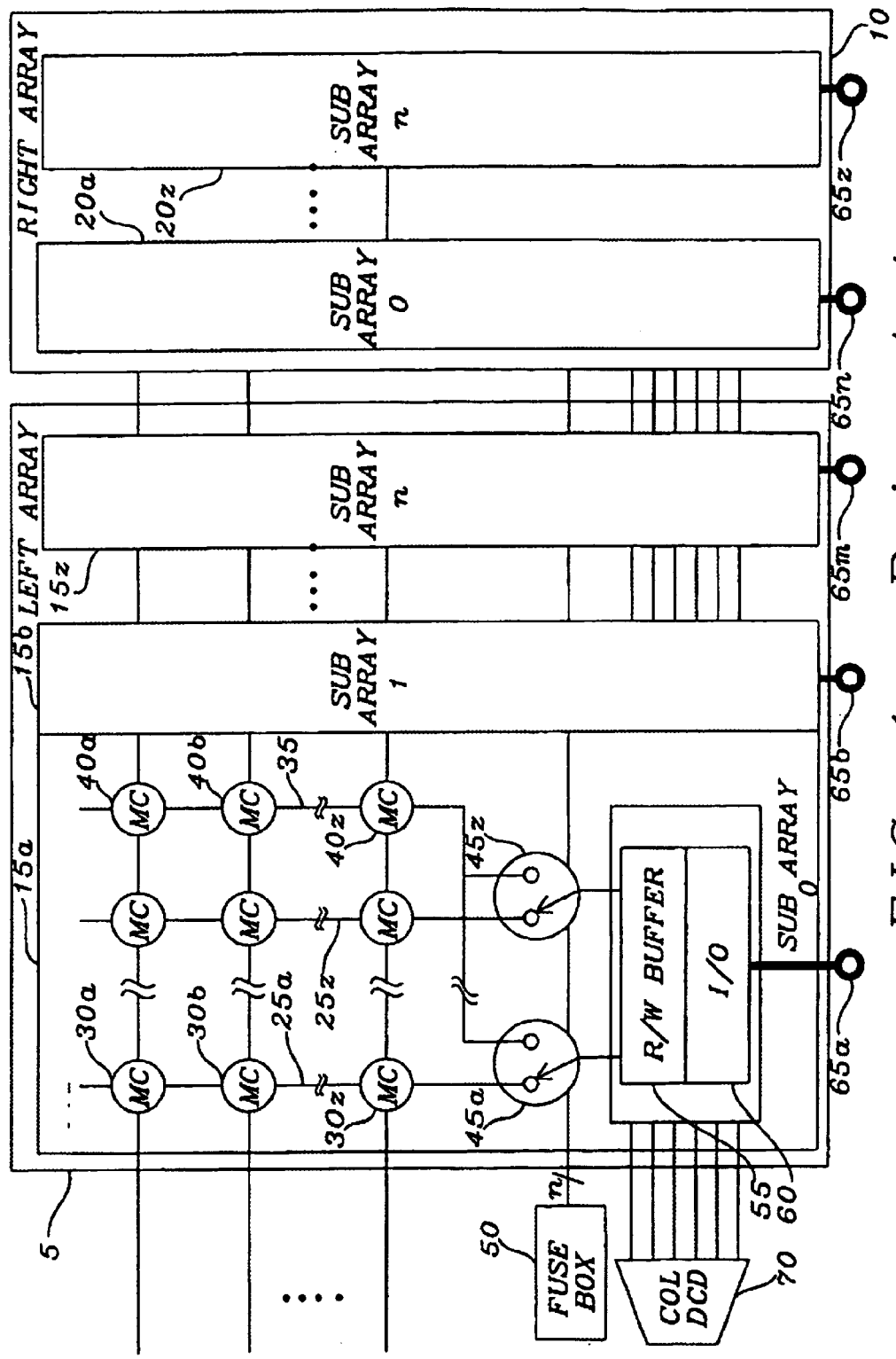
FIG. 1 is a diagram of a memory array illustrating yield enhancement employing redundant columns of the prior art.
Figure 2:
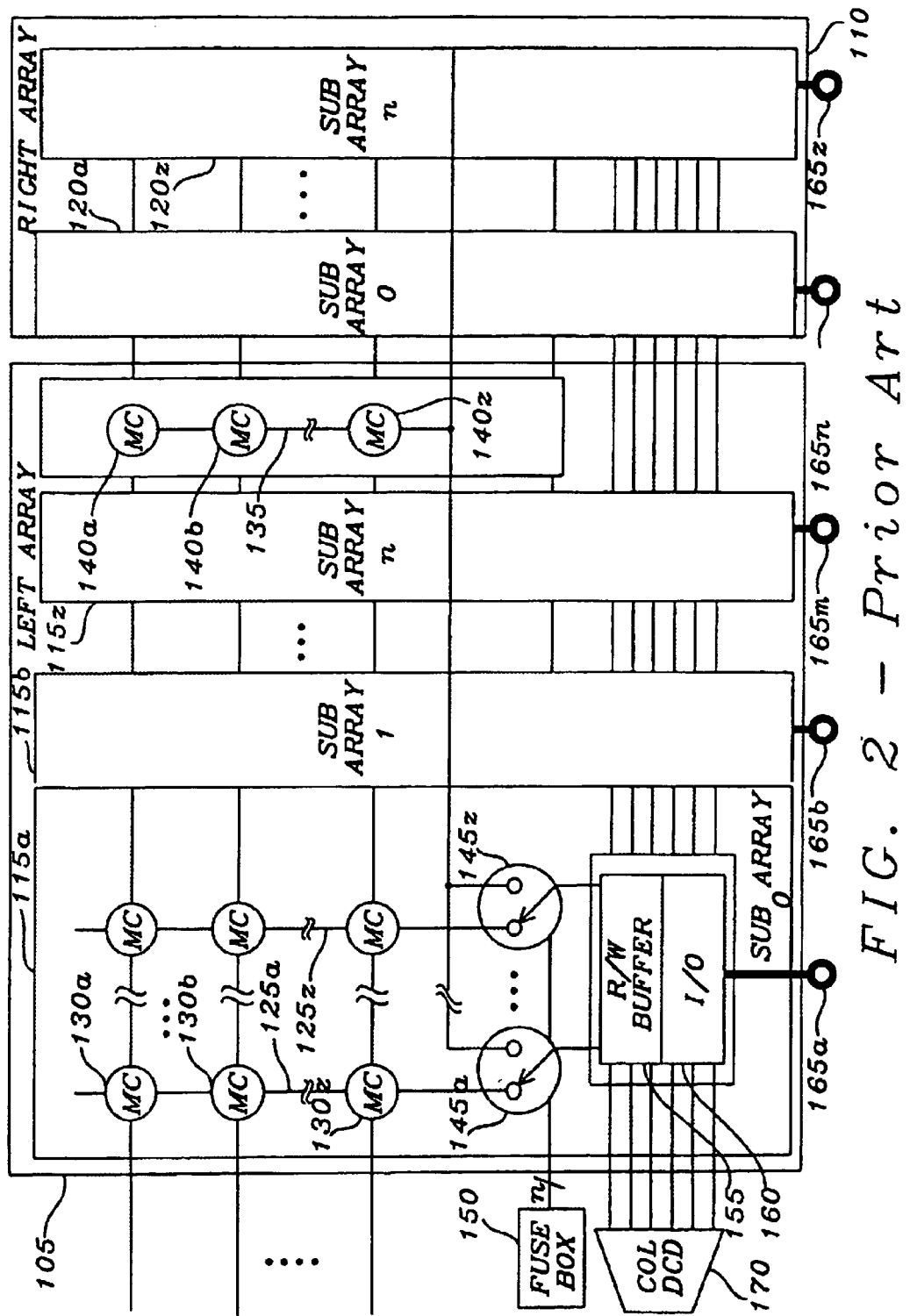
FIG. 2 is a diagram of a memory array illustrating yield enhancement employing redundant columns of the prior art.

The memory circuit of this invention is particularly suited (but not exclusively) to SRAM that is embedded with other circuitry in an integrated circuit. The memory circuit of this invention incorporates an architecture that permits a single redundant column of memory cells and minimizes the effects of the interconnection wiring of the redundant column on the performance of the memory. The single redundant column of memory cells is placed relatively central to the placement of the arrays of memory cells for which the redundant column is to provide yield enhancement protection.

A fault indication device is associated with each column of the arrays of memory cells. Generally, the fault indication device has a fuse that is destroyed if the associated column of memory cells has a fault. This causes a fault signal that is transmitted to selected adjacent fault indication devices. The fault indication device has a combinational logic circuit such as an OR gate that combines the fault signal of the fault indication device with the selected fault indication devices transmitting their fault signals to the current fault signal device. This structure permits the locating of the column of memory cells having the fault.

A fault detection device collects the results of the logical combination of all the fault signals to determine that a redundancy should be implemented. The fault detection device activate activates a redundancy implementation signal indicating that redundancy is to be applied. Further the redundancy implementation signal is structured to indicate which array has the fault in instances of multiple arrays that are protected by one redundant column of memory cells.

Each column of memory cells has its own read/write buffer to sense data from or store data in selected cells in the column of memory cells. The input and output ports of the read/write buffer is connected respectively to the output of a first multiplexer and the primary input of a second multiplexer. The primary input of the second multiplexer is connected to the output of the read/write circuit of an adjacent column of memory cells. An input/output circuit is associated with each column of memory cells. The input from external circuits as received by the input/output circuit is transferred to the primary input of the first multiplexer and to the secondary input of the first multiplexer of an adjacent column of memory cells.

Each column of memory cells has an associated multiplex control circuit connected to the first and second multiplexers of the associated column of memory cells. The fault signal of the associated fault indication device and the redundancy implementation signal are applied to the multiplex control circuit to determine whether the associated column of memory cells is used or the adjacent column of memory cells is used to sense or store data for the associated input/output circuit.

The column of the memory array for which the redundant column of memory cells provides protection is nearest to the redundant column of memory cells and is connected such that the redundant column of memory cells is adjacent to the column of memory cells. The redundant column of memory cells has its own read/write buffer to sense data from and store data to the redundant column of memory cells once redundancy is implemented. The output of the read/write buffer associated with the redundant column of memory cells is connected to each of the second inputs of the second multiplexers of each of the columns of memory to which the redundant column of memory cells is adjacent. The read/write buffer is connected to receive the output of a redundancy multiplexer whose inputs are connected to the input/output circuits of the adjacent columns of memory cells.

When there is no fault in any of the columns of memory cells none of the fuse are destroyed and the fault signal and the redundancy implementation signals are not activated. The first and second multiplexers are set such that the data signals from the input/output circuit are transferred to the associated column of memory cells. However, if there is a fault in a column of memory cells, the fuse associated with the faulty column of memory cells is destroyed and the fault signal is activated. The fault signal for all the fault indication devices for the columns of memory cells placed between the faulty column of memory cells and the redundant column of memory cells is also activated. The redundancy implementation signal is activated indicating which of the arrays contains the fault.

For columns of memory cells not between the faulty column of memory cells and the redundant column of memory cells and the columns of memory cells in other memory arrays, the fault signal is not activated. The first and second multiplexers of these columns receive the redundancy implementation signal and the inactive fault signal. The multiplexers associated with these columns transfer the data signals from the input/output circuits to their associated columns of memory cells.

For those columns having their fault signals activated and the redundancy implementation signal activated, the multiplexer for those columns transfer the data signals from the input/output circuit to the adjacent column. The last column of the array with the faulty column of memory cells is now the redundant column of memory cells.

Figure 3:
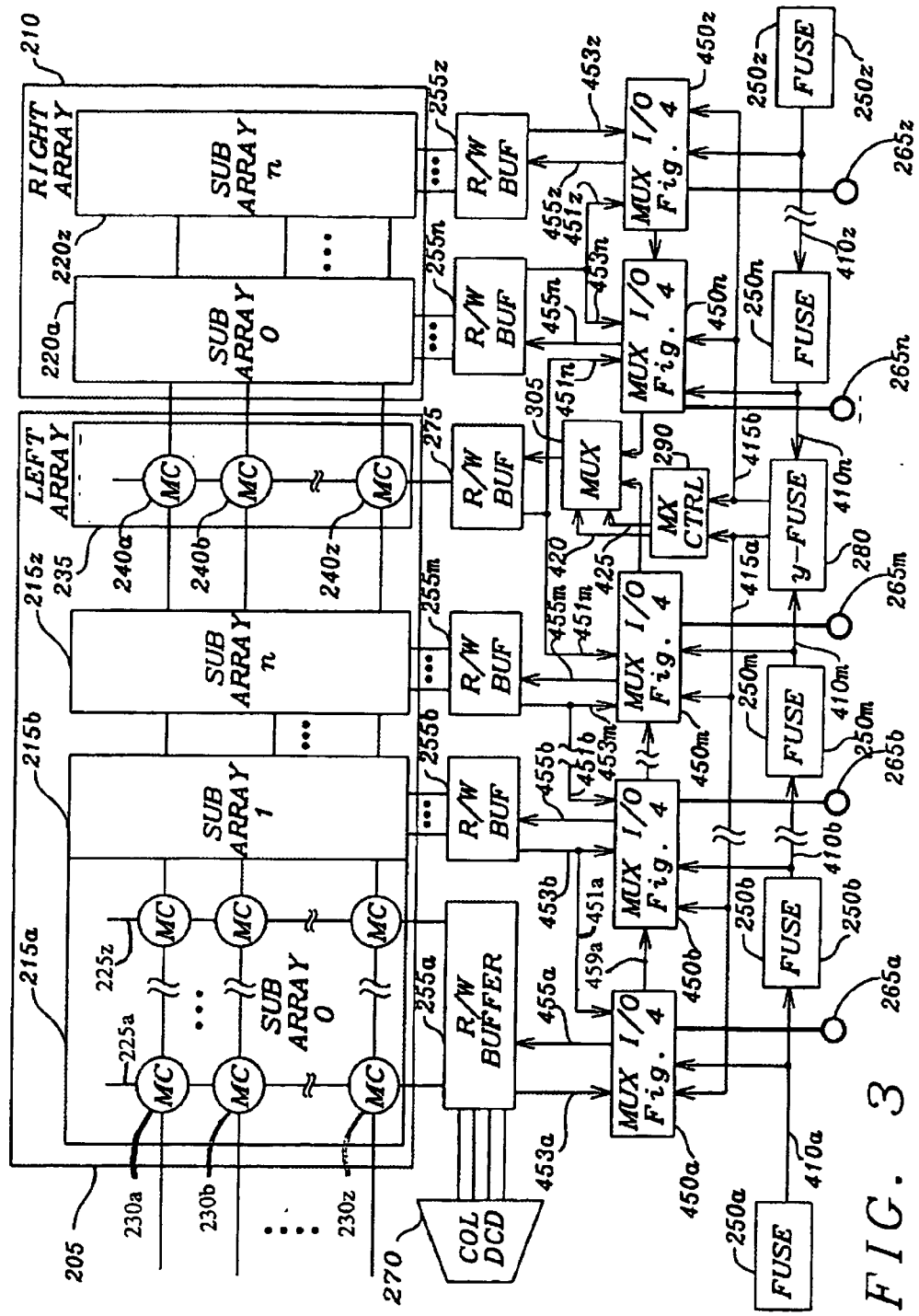
FIG. 3 is a diagram of a memory array illustrating yield enhancement employing redundant columns of this invention.
Figure 4:
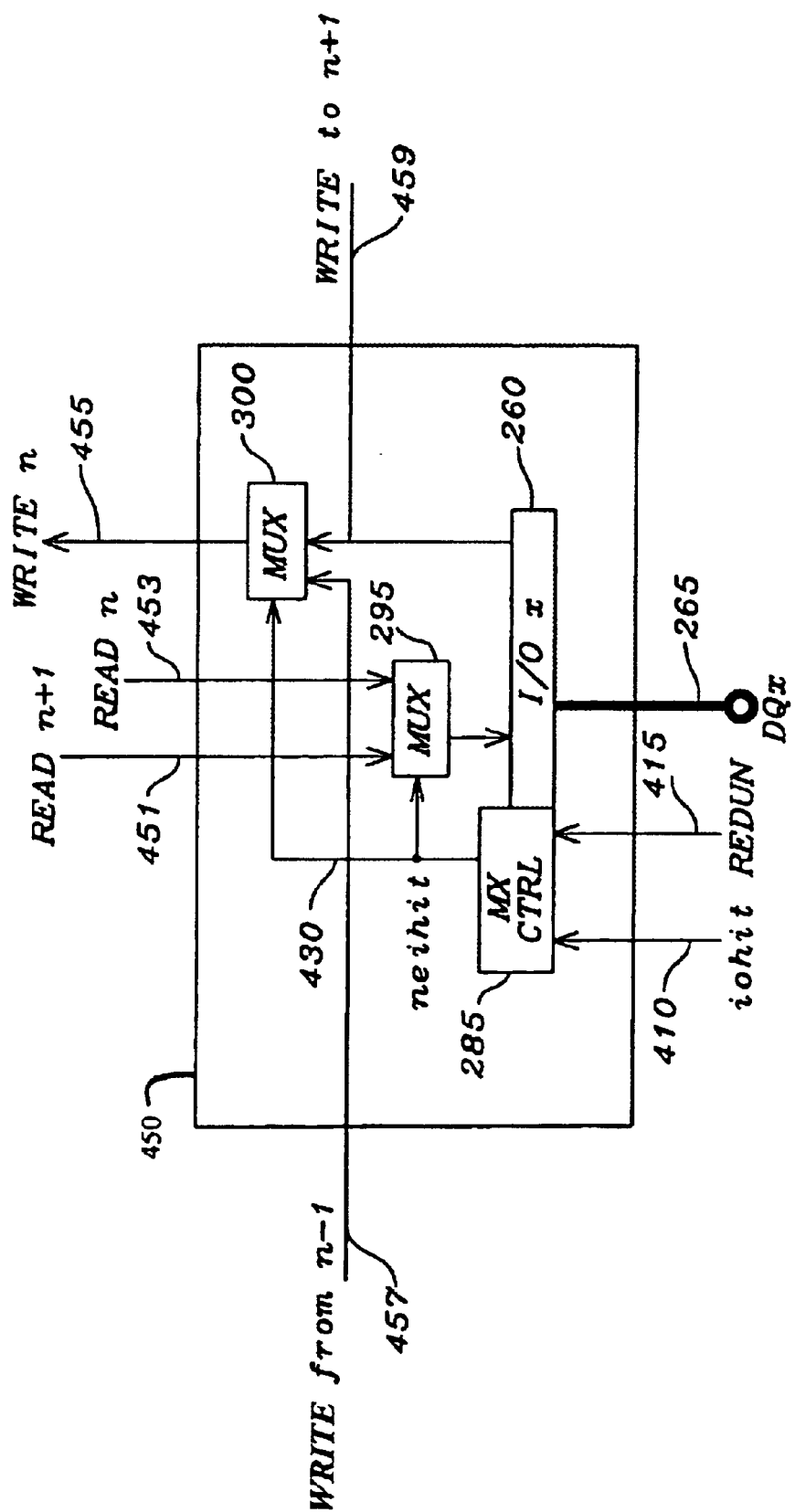
FIG. 4 is a schematic diagram of the multiplexer-Input/Output circuit of FIG. 3.
Figure 5:
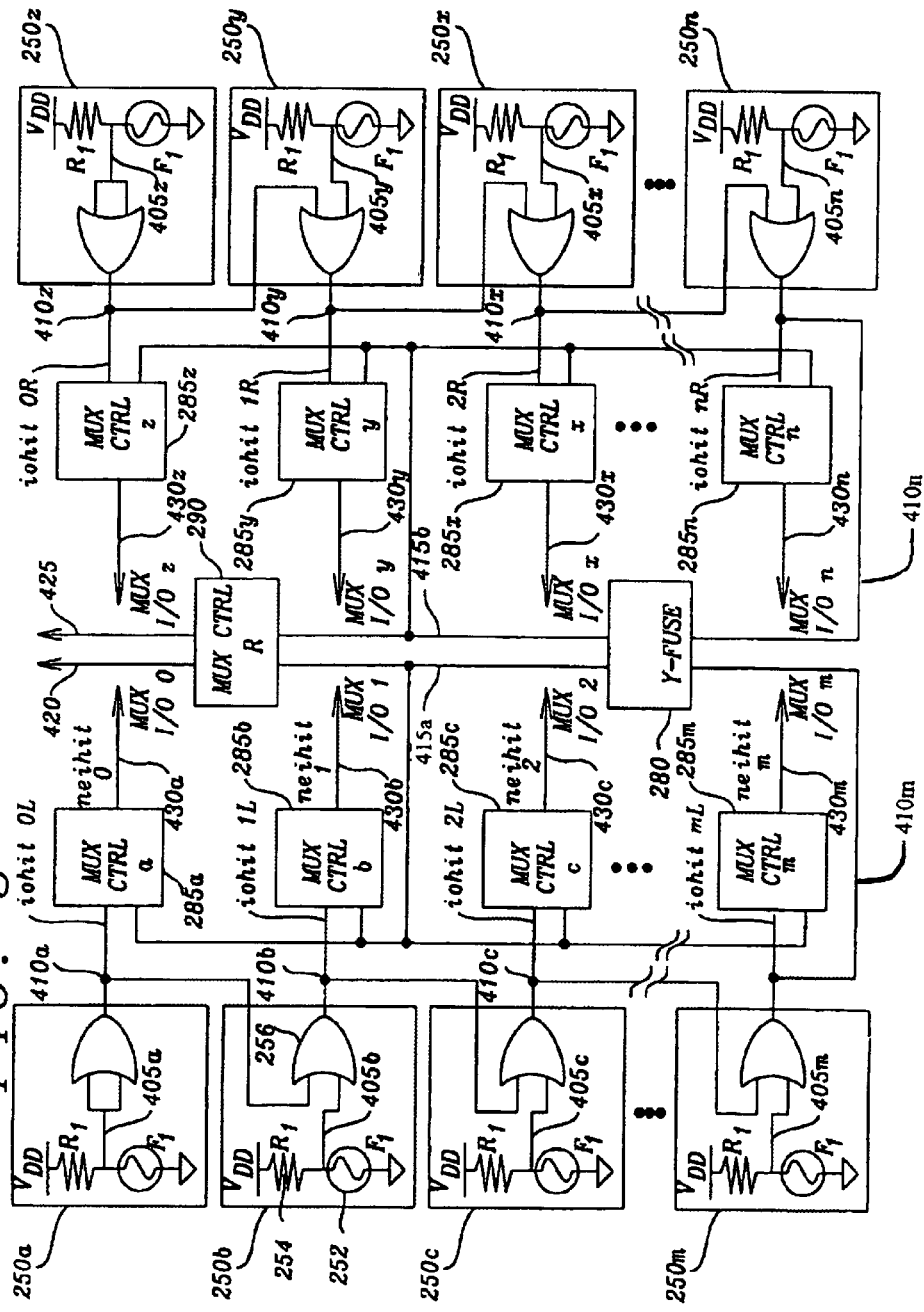
FIG. 5 s a diagram of the yield enhancement circuit of this invention.

Refer now to FIGS. 3, 4, and 5 for a more detailed discussion of the integrated circuit memory with a yield enhancement circuit of this invention. In this illustration, the memory is constructed of two arrays of memory cells 205 and 210. Within the two memory arrays 205 and 210, sub-arrays 215$a$, 215$b$, . . . , 215$z$ and 220$a$, . . . , 220$z$ are composed of columns 225$a$, . . . , 225$z$ of memory cells 230$a$, 230$b$, . . . , 230$z$. A redundant column 235 of memory cells 240$a$, 240$b$, . . . , 240$z$ is positioned to be associated with the memory arrays 205 and 210. Each of the columns 225$a$, . . . , 225$z$ of memory cells 230$a$, 230$b$, . . . 230$z$ is connected to one read/write buffer circuit 255$a$, 25$z$. The redundant column 235 of memory cells 240$a$, 240$b$, . . . , 240$z$ is connected to its own read/write buffer 275.

The sub-arrays 215$a$, 215$b$, . . . , 215$z$ and 220$a$, . . . , 220$z$ are shown as having multiple columns with an associated read/write buffer circuit 255$a$, . . . , 255$z$. The column decoder 270 decodes a column address signal to select which of the columns 225$a$, . . . , 225$z$ of memory cells 230$a$, 230$b$, . . . , 230$z$ is to be connected to the read/write buffer circuit 255$a$, . . . , 255$z$. Alternately, the read/write buffer circuit 255$a$, . . . , 255$m$, 255$n$, . . . 255$z$ has sufficient circuitry to have individual read/write buffer circuits for each column 225$a$, . . . , 225$z$ of memory cells 230$a$, 230$b$, . . . , 230$z$. The structure of the yield enhancement circuit of this invention is described as if there were single columns 225$a$, . . . , 225$z$ of memory cells 230$a$, 230$b$, . . . , 230$z$ associated with a read/write buffer circuit 255$a$, . . . , 255$z$. It would be apparent to one skilled in the necessary changes to have multiple columns 225$a$, . . . , 225$z$ of memory cells 230$a$, 230$b$, . . . , 230$z$ associated with the read/write buffer circuit 255$a$, . . . , 255$m$, 255$n$, . . . 255$z$.

In the prior art, the read write buffer circuits are connected to be in direct communication with the associated input/output circuit. In the memory integrated circuit of this invention, the input and output ports of each of the read/write buffer circuits 225$a$, . . . , 255$m$,255$n$, . . . 255$z$ is connected respectively to the multiplexer-Input/Output circuit (MUX I/O) 450$a$, . . . , 450$z$. FIG. 4 shows the internal components of a typical multiplexer-Input/Output circuit 450. Designations in FIG. 4, such as 410 (iohit), 451 (READ n+1). 453 (READ n), 455 (WRITE n), 457 (WRITE from n−1) and 459 (WRITE to n+1) have corresponding designations for specific MUX I/O circuit blocks shown in FIG. 3. For example, corresponding signals for MUX I/O 450$a$ are 410$a$, 451$a$, 453$a$, 455$a$, and 459$a$ respectively. Referring to FIG. 3, each of the input ports 455$a$, . . . 455$z$ of each of the read/write buffer circuits 255$a$, . . . , 255$m$,255$n$, . . . 255$z$ is connected to an output 455$a$, . . . , 455$m$,455$n$, . . .

455$z$ of an associated MUX I/O, 450$a$, . . . , 450$m$,450$n$, . . . 450$z$. As shown in FIG. 4, output 455 of each MUX I/O 450 is generated by first multiplexer 300. Each of output ports 453$a$, . . . , 453$z$ of each of the read/write buffer circuits 255$a$, . . . , 255$m$,255$n$, . . . 255$z$ of FIG. 3 is connected to the respective primary input 453$a$, . . . , 453$m$,453$n$, . . . 453$z$ of a second multiplexer (shown in detail in FIG. 4 as 295), which is an element of each respective MUX I/O 450$a$, . . . , 450$m$, 450$n$, . . . 450$z$. Referring to FIG. 4, the secondary input 451 (READ n+1) (represented by 451$a$, 451$b$, . . . 451$m$, 451$n$, . . . 451$z$ in FIG. 3) of the second multiplexer 295 is connected to signal 453 (READ n), which is shown in FIG. 4 for each MUX I/O depicted there as the output ports 453$a$, . . . , 453$z$ of each of the read/write buffer circuits 255$a$, . . . , 255$m$,255$n$, . . . 255$z$ of an adjacent column 225$a$, . . . , 225$z$ of memory cells 230$a$, 230$b$, . . . , 230$z$ or an adjacent sub-array 215$a$, 215$b$, . . . , 215$z$ and 220$a$, . . . 220$z$ of FIG. 3. Each MUX I/O 450$a$, 450$b$, . . . , 450$m$,450$n$, . . . , 450$z$ contains an input/output circuit 260 (shown in FIG. 4) associated with each sub-array 215$a$, 215$b$, . . . , 215$z$ and 220$a$, . . . , 220$z$ of FIG. 3. As shown in a typical MUX I/O in FIG. 4, the input 265 (DQx) (represented by 265$a$, 265$b$, . . . 265$m$,265$n$, . . . 265$z$ in FIG. 3) from external circuits as received by the input/output circuit 260 is transferred to the primary input of the first multiplexer 300 and as an output 459 of the multiplexer-Input/Output circuit 450. The output e.g. 459 of one MUX I/O(e.g. 450$a$ in FIG. 3) is connected to the secondary input 457 (WRITE from n−1) of the first multiplexer 300 of a multiplexer-Input/Output Input/Output circuit 450 associated with an adjacent column or sub-array. For example, the output 459$a$ from MUX I/O 450$a$ is connected to the input (457 in FIG. 4) to adjacent MUX I/O 450$b$ as shown in FIG 3.

Each multiplexer-Input/Output circuit 450$a$, . . . , (depictied in a typical case in FIG. 4 as 450) has a multiplex control circuit 285 connected to the first multiplexers 300 and second multiplexer 295. The multiplex control circuit 285 receives a redundancy implementation signal (REDUN) 415 and the redundancy implementation signal (iohit *) 410. Referring back to FIG. 5, the fault signal of an associated fault indication device 250$a$, . . . , 250$m$, 250$n$, . . . 250$z$ generates a redundancy implementation signal 410$a$, 410$b$ 410$c$. . . , 410$m$, 410$x$, 410$y$ (iohit *0L, iohit 1L, iohit 2L, . . . , iohit mL, iohit nR, . . . , iohit 2R, iohit 1R, iohit 0R), shown as 410 in FIG. 4 that is applied to the multiplex control circuit 285 to generate the multiplex control signals (neihit *) 430 of FIG. 4 that determine whether data reads on line 265 come from line 453 (READ n) or line 451 (READ n+1) and whether data writes on line 265 go to line 455 (WRITE) or line 459 (WRITE to n+1). In other words, whetheter data reads and writes are made to and from the default column when there is no fault or to and from the adjacent column when there is a fault. For example wheter data reads and writes on line 265$a$ (FIG.3) are made to and from leftmost column 225$a$ or the next adjacent column (not shown).

Each of the fault indication devices 250$a$, . . . , 250$n$, . . 250$z$ as shown in FIG. 5, have a fuse (F1) shown typically in block 250$b$ as 252 that is connected between the ground reference point and typical resistor 254. The resistor 254 is connected between the power voltage source $V_{DD}$ and the fuse 252. The junction of the fuse 252 and the resistor 254 is the terminal 405$b$ that provides the fault signal. If there is no fault in an associated column 225$a$, . . . , 225$z$ of memory cells 232$a$, 230$b$, . . . , 230$z$ of the sub-arrays 215$a$, 215$b$, . . . , 215$z$ and 220$a$, . . . , 230$z$ the fuse is intact and the fault signal is at an inactive state (0). Alternately, if there is a fault in an associated column 225a, . . . , 225z of memory cells 230a, 230, 230b, . . . , 230z of the sub-arrays 215a, 215b, . . . , 215z and 220a, . . . , 220z, the fuse destroyed and the fault signal is at an active state (1). Each of the fault indication devices shown in FIG. 5 as 250a, . . . , 250m, 250n, . . . 250z further has a logical combining circuit marked typically in block 250b as 256 which combines the fault signal 405a, . . . , 405m, 405n, . . . 405z of the present fault indication devices 250a, . . . , 240m, 250n, . . . 250z with the combined fault signal 410a, . . . , 410m, 410n, . . . 410z of an adjacent fault indication device 250a, . . . 250m, 250n, . . . , 250z that is in the direction opposite the redundant column 235 of the memory cells 240a, 240b, . . . , 240z as shown in FIG.3.

Referring to FIG. 5, the logical combination of the fault signals 410m and 410n from each array 205 and 210 is applied to the fault detection circuit 280 (Y FUSE). The fault detection circuit 280 combines the logical combination of fault signals 410m and 410n to create the redundancy implementation signals 415a and 415b. The fault detection circuit 280 is connected to the multiplex control circuits 285a, 215b, 285c, . . . 285m,285n, . . . , 285x, 285y, 285z (MUX CTRL a, MUX CTRL b, MUX CTRL c, . . . , MUX CTRL m, MUX CTRL n, . . . , MUX CTRL x, MUX CTRL y, MUX CTRL z) to transfer the redundancy implementation signal 415a to the multiplexer control circuit 285a, . . . , 285m for the left array 205 and the redundancy implementation signal 415b to the multiplex control circuit 285n, 285z for the right array 210.

Referring to FIG. 3, the read/write buffer 275 is connected to the multiplexer 305 that receives the input data signals from the adjacent input/output circuits 260 of MUX I/O's 450m and 450n of the left array 205 and the right array 210. The multiplexer 305 is connected to the multiplex control circuit 290 to receive the a redundancy signal 420 indicating the existence of a fault within one of the memory arrays 205 and 210 and the array selection switch signal 425 indicating which array 205 or 210 has the fault. The fault detection circuit 280 is connected to the multiplex control circuit 290 associated with the redundant column 235 of memory cells 240a, 240b, . . . , 240z to provide the redundancy implementation signals 415a and 415b.

If there are no faults in the memory arrays 205 and 210, the multiplex control circuits 285a, . . . , 285m,285n, 285z for the first multiplexers 300 and second multiplexers 295 contained in respective MUX I/O's 450a, . . . , 450m, 450n, . . . , 450z are set such that the data signals are directly transferred between the sub-arrays 215a, 215b, . . . , 215z and 220a, . . . , 220z and their associated input/output circuits 260 contained in respective MUX I/O's 450a, . . . , 450m, 450n, . . . 450z. However, if for instance, a column of the sub-array 1 215b (FIG. 3) has a fault, the fuse 252 within the fault indication circuit 250b (FIG. 5) is destroyed to activate the fault signal 405b. The logic combination circuit 256 provides a logical ORing of the fault signals from the fuse 252 and the adjacent fault indication circuit that is opposite the fault indication circuit 250b from the redundant column 235 of memory cells 240a, 240b, . . . , 240z. The ORing of the fault signal activates a combined fault signal 410b. The successive fault indication signals combine the combined fault signal 410b, . . . , 410m to generate the input 410m to the fault detection circuit 280. The left redundancy implementation signal 415a is activated and the right redundancy implementation signal 415b remains inactive, thus indicating that the fault exists in the left memory 205 (shown in FIG. 3).

Referring to FIG. 5, the multiplex control circuit 285a (MUX CTRL a) receives an inactive combined fault signal 410a (iohit 0L) and an active redundancy implementation signal 415a. The multiplex control circuit 285a (MUX CTRL a) sets the multiplex control signal (neihit 0) 430a such that (referring now to FIG. 4, in a detail of a typical MUX I/O circuit) the first multiplexer 300 and the second multiplexer 295 transfer the data signals from the input/output circuit 260 to signal line 455 (WRITE n). Referring now to FIG. 3, the output of MUX I/O 450a, 455a is connected to R/W BUFFER 255a, which is connected to its associated sub-array (SUB ARRAY 0,) 215a. In similar fashion, referring to FIG. 5, the combined fault signals 410b, . . . , 410m and the redundancy implementation signal 415a are the inputs respectively to the multiplex control circuits 285b, . . . , 285m for the left array 205 (as shown in FIG. 3). In the example being described, these signals are active causing the multiplex control circuits 285b, . . . , 285m to set the multiplex control signals (neihit *1, . . . ,neihit m) 430b, 430m to cause the first multiplexers 300 and second multiplexers 295 in each of MUX I/O blocks 450b, . . . , 450m to transfer the data signals from the input/output circuits 260 in each of MUX I/O blocks 450b, . . . , 450m to and from the adjacent columns of the sub-arrays 215b, . . . , 215z. Corresponding multiplex control signals for the right array are 430n, . . . 430x, 430y, 430z. The multiplexers 295 in MUX I/O 450m and 305 are set to transfer the data signals between the input/output circuit 260 in MUX I/O 450m and the redundant column 235 of memory cells 240a, 240b, . . . , 240z.

The redundancy implementation signal 415b and the combined fault signals 410n, . . . 410z are not activated. The data signals from the input/output circuit in MUX I/O 450n. . . 450z are transferred between their associated columns of the sub-arrays 220a, . . . , 220z.

In summary, the circuit as described in FIGS. 3, 4 and 5 performs a method for yield enhancement of an integrated circuit by substituting a redundant circuit for a faulty circuit of the integrated circuit. The circuit provides a fault indication associated with each sub-circuit of the integrated circuit such that one fault indication is activated to generate a fault signal to express existence of a fault within the faulty circuit of the integrated circuit. Additionally, each fault indication associated with selected adjacent sub-circuits of the integrated circuit activates IS the fault signal to express the existence of the fault within the faulty circuit of the integrated circuit. The circuit then determines the existence of the faulty circuit within the integrated circuit from the fault signal. A redundancy implementation signal is generated upon determination of the existence of the faulty circuit. Redundancy is activated upon generating the redundancy implementation signal and one of the fault indications associated with the sub-circuit to selectively transfer input/output signals of the sub-circuit associated with the fault indication and an adjacent sub-circuit to a designated path dependent on the expression of the existence of a fault within the integrated circuit.

If the fault indication is not activated, thus indicating that the associated sub-circuit has no fault and the redundancy implementation signal indicates that no fault exists in the integrated circuit, the input/output signals of the circuit are transferred to their designated path. If the fault indication is not activated indicating that the associated sub-circuit has no fault, but the redundancy implementation signal indicates that the fault exists in the integrated circuit, the input/output signals of the circuit are transferred to their designated path. However, if the fault indication is activated indicating existence of a faulty circuit and the redundancy implementation signal indicates that the fault exists in said integrated circuit, the input/output signals of said adjacent sub-circuit are transferred to the designated path.

While this invention has been particularly shown and described with reference to the preferred embodiments thereof, it will be understood by those skilled in the art that various changes in form and details may be made without departing from the spirit and scope of the invention.

The invention claimed is:

1. A yield enhancement circuit for substituting a redundant circuit for a faulty circuit of an integrated circuit, comprising:
   a plurality of fault indication devices, wherein each fault indication device is associated with one sub-circuit of the integrated circuit such that one fault indication device is activated to generate a fault signal to express existence of a fault within the faulty circuit of said integrated circuit, additionally each fault indication device that is associated with selected adjacent sub-circuits of the integrated circuit activates the fault signal to express existence of the fault within the faulty circuit of said integrated circuit;
   a fault detection device in communication with the plurality of fault indication devices to determine the existence of the faulty circuit within the integrated circuit and transmit a redundancy implementation signal upon determination of existence of the faulty circuit; and
   a plurality of redundancy activation circuits in communication with the fault detection device to receive the redundancy implementation signal, each redundancy activation circuit in communication with one of the fault indication devices and associated with the sub-circuit to which said fault indication device is associated and to which said fault indication device selectively transfers input/output signals of the sub-circuit associated with the fault indication device and its adjacent sub-circuit to a designated path dependent on the expression of the existence of a fault within the integrated circuit.

2. The yield enhancement circuit of claim 1 wherein if the fault indication device is not activated indicating that the associated sub-circuit has no fault and the redundancy implementation signal indicates that no fault exists in said integrated circuit, the input/output signals of said circuit are transferred to their designated path.

3. The yield enhancement circuit of claim 1 wherein if the fault indication device is not activated indicating that the associated circuit has no fault, but the redundancy implementation signal indicates that the fault exists in said integrated circuit, the input/output signals of said circuit are transferred to their designated path.

4. The yield enhancement circuit of claim 1 wherein if the fault indication device is activated indicating existence of a faulty circuit and the redundancy implementation signal indicates that the fault exists in said integrated circuit, the input/output signals of said adjacent sub-circuit are transferred to the designated path.

5. The yield enhancement circuit of claim 1 wherein the integrated circuit is a memory.

6. The yield enhancement circuit of claim 5 wherein the memory is selected from the set of memories comprising static random access memory, dynamic random access memory, non-volatile random access memory.

7. The yield enhancement circuit of claim 5 wherein each of the sub-circuits comprises a column of memory cells and a read/write buffer connected to the column of memory cells.

8. The yield enhancement circuit of claim 1 wherein the designated path is an input/output driver/receiver circuit that transfers the input/output signals from/to external circuitry.

9. The yield enhancement circuit of claim 1 wherein each fault indication device comprises a fuse, whereby when said fuse is intact, said sub-circuit does not contain the fault and when said fuse is not intact, said sub-circuit contains the fault.

10. The yield enhancement circuit of claim 9 wherein each fault indication device further comprises a logical combining circuit to logically combine each fault signal of each fault indication device with the fault signal of the fault indication device that is associated with selected adjacent sub-circuits.

11. A yield enhancement circuit within a memory integrated circuit for substituting redundant groups of memory cells for faulty groups of memory cells within said memory integrated circuit, comprising:
   a plurality of fault indication devices, wherein each fault indication device is associated with one group of memory cells of the memory integrated circuit such that one fault indication device is activated to generate a fault signal to express existence of a fault within the faulty group of memory cells of said memory integrated circuit, additionally each fault indication device that is associated with a selected adjacent group of memory cells of the memory integrated circuit generates the fault signal to express the existence of the fault within the faulty group of memory cells of said memory integrated circuit;
   a fault detection device in communication with the plurality of fault indication devices to determine the existence of the faulty group of memory cells within the memory integrated circuit and transmit a redundancy implementation signal upon determination of existence of the faulty group of memory cells; and
   a plurality of redundancy activation circuits in communication with the fault detection device to receive the redundancy implementation signal, each redundancy activation circuit in communication with one of the fault indication devices and associated with the group of memory cells to which said fault indication device is associated and associated to an adjacent group of memory cells of said group of memory cells to which said fault indication device is associated to selectively transfer input/output signals of the group of memory cells associated with the fault indication device and its adjacent group of memory cells to a designated path dependent on the expression of the existence of a fault within the memory integrated circuit.

12. The yield enhancement circuit of claim 11 wherein if the fault indication device is not activated indicating that the associated group of memory cells has no fault and the redundancy implementation signal indicates that no fault exists in said memory integrated circuit, the input/output signals of said circuit are transferred to their designated path.

13. The yield enhancement circuit of claim 11 wherein if the fault indication device is not activated indicating that the associated circuit has no fault, but the redundancy implementation signal indicates that the fault exists in said memory integrated circuit, the input/output signals of said circuit are transferred to their designated path.

14. The yield enhancement circuit of claim 11 wherein if the fault indication device is activated indicating existence of a faulty group of memory cells and the redundancy implementation signal indicates that the fault exists in said memory integrated circuit, the input/output signals of said adjacent group of memory cells are transferred to the designated path.

15. The yield enhancement circuit of claim 11 wherein the memory integrated circuit is selected from the set of memory integrated circuits consisting of static random access memory, dynamic random access memory, and non-volatile random access memory.

16. The yield enhancement circuit of claim 15 wherein each of the group of memory cells comprises a column of memory cells and a read/write buffer connected to the column of memory cells to selectively sense stored in said column of memory cells and to store data to said column of memory cells.

17. The yield enhancement circuit of claim 11 wherein the designated path is an input/output driver/receiver circuit that transfers the input/output signals from/to external circuitry.

18. The yield enhancement circuit of claim 11 wherein each fault indication device comprises a fuse, whereby when said fuse is intact, said group of memory cells does not contain the fault and when said fuse is not intact, said group of memory cells contains the fault.

19. The yield enhancement circuit of claim 18 wherein each fault indication device further comprises a logical combining circuit to logically combine each fault signal of each fault indication device with the fault signal of the fault indication device that is associated with selected adjacent group of memory cells.

20. A memory comprising:
  at least one array of memory cells, each array of memory cells arranged in rows and columns of memory cells;
  at least one redundant column of memory cells associated with at least one of said arrays of memory cells to replace a faulty column of memory cells; and
  a yield enhancement circuit in communication with at least one array of said memory cells and said redundant columns of memory cells for substituting redundant column of memory cells for a faulty column of memory cells within said associated arrays of memory cells, said yield enhancement circuit comprising:
    a plurality of fault indication devices, wherein each fault indication device is associated with one column of memory cells of the arrays of memory cells such that one fault indication device is activated to generate a fault signal to express existence of a fault within the faulty column of memory cells of said arrays memory cells, additionally each fault indication device that is associated with a selected adjacent column of memory cells of the arrays of memory cells generates the fault signal to express existence of the fault within the faulty column of memory cells of said arrays of memory cells;
    a fault detection device in communication with the plurality of fault indication devices to determine the existence of the faulty column of memory cells within the arrays of memory cells and transmit a redundancy implementation signal upon determination of existence of the faulty column of memory cells; and
    a plurality of redundancy activation circuits in communication with the fault detection device to receive the redundancy implementation signal, each redundancy activation circuit in communication with one of the fault indication devices and associated with the column of memory cells to which said fault indication device is associated and associated to an adjacent column of memory cells of said column of memory cells to which said fault indication device is associated to selectively transfer input/output signals of the column of memory cells associated with the fault indication device and its adjacent column of memory cells to a designated path dependent on the expression of the existence of a fault within the arrays of memory cells.

21. The memory of claim 20 wherein if the fault indication device is not activated indicating that the associated column of memory cells has no fault and the redundancy implementation signal indicates that no fault exists in said arrays of memory cells, the input/output signals of said circuit are transferred to their designated path.

22. The memory of claim 20 wherein if the fault indication device is not activated indicating that the associated circuit has no fault, but the redundancy implementation signal indicates that the fault exists in said arrays of memory cells, the input/output signals of said circuit are transferred to their designated path.

23. The memory of claim 20 wherein if the fault indication device is activated indicating existence of a faulty column of memory cells and the redundancy implementation signal indicates that the fault exists in said arrays of memory cells, the input/output signals of said adjacent column of memory cells are transferred to the designated path.

24. The memory of claim 20 wherein the arrays of memory cells are selected from the set of arrays of memory cells consisting of static random access memory cells, dynamic random access memory cells, and non-volatile random access memory cells.

25. The memory of claim 24 wherein each of the column of memory cells comprises a column of memory cells and a read/write buffer connected to the column of memory cells to selectively sense data stored in selected memory cells and to store data to said selected memory cells.

26. The memory of claim 20 wherein the designated path is an input/output driver/receiver circuit that transfers the input/output signals from/to external circuitry.

27. The memory of claim 20 wherein each fault indication device comprises a fuse, whereby when said fuse is intact, said column of memory cells does not contain the fault and when said fuse is not intact, said column of memory cells contains the fault.

28. The memory of claim 27 wherein each fault indication device further comprises a logical combining circuit that logically combine each fault signal of each fault indication device with the fault signal of the fault indication device that is associated with selected adjacent column of memory cells.

29. A method for yield enhancement of an integrated circuit by substituting a redundant circuit for a faulty circuit of said integrated circuit, comprising the steps of: providing fault indication associated with each sub-circuit of the integrated circuit such that one fault indication generates a fault signal to express the existence of a fault within the faulty circuit of said integrated circuit, additionally each fault indication associated with selected adjacent sub-circuits of the integrated circuit generates the fault signal to express the existence of the fault within the faulty circuit of said integrated circuit;
  determining the existence of the faulty circuit within the integrated circuit from said fault signal;
  generating a redundancy implementation signal upon determination of existence of the faulty circuit; and
  initiating redundancy activation upon generating the redundancy implementation signal and one of the fault indications associated with the sub-circuit to selectively transfer input/output signals of the sub- circuit associated with the fault indication and an adjacent sub-circuit to a designated path dependent on the expression of the existence of a fault within the integrated circuit.

30. The method of claim 29 wherein if the fault indication is not activated indicating that the associated sub-circuit has no fault and the redundancy implementation signal indicates that no fault exists in said integrated circuit, the input/output signals of said circuit are transferred to their designated path.

31. The method of claim 29 wherein if the fault indication is not activated indicating that the associated sub-circuit has no fault, but the redundancy implementation signal indicates that the fault exists in said integrated circuit, the input/output signals of said circuit are transferred to their designated path.

32. The method of claim 29 wherein if the fault indication is activated indicating existence of a faulty circuit and the redundancy implementation signal indicates that the fault exists in said integrated circuit, the input/output signals of said adjacent sub-circuit are transferred to the designated path.

33. The method of claim 29 wherein the integrated circuit is a memory.

34. The method of claim 33 wherein the memory is selected from the set of memories comprising static random access memory, dynamic random access memory, non-volatile random access memory.

35. The method of claim 29 wherein each of the sub-circuits comprise a column of memory cells and a read/write buffer connected to the column of memory cells.

36. The method of claim 29 wherein the designated path is an input/output driver/receiver circuit that transfers the input/output signals from/to external circuitry.

37. The method of claim 29 wherein each fault indication is generated by a fuse, whereby when said fuse is intact, said sub-circuit does not contain the fault and when said fuse is not intact, said sub-circuit contains the fault.

38. The method of claim 37 wherein each fault indication further generates a logical combining circuit that logically combines each fault indication with the fault indication that is associated with selected adjacent sub-circuits.

* * * * *